United States Patent [19]
Pavlin et al.

[11] Patent Number: 5,159,207
[45] Date of Patent: Oct. 27, 1992

[54] CIRCUIT FOR DYNAMIC ISOLATION OF INTEGRATED CIRCUITS

[75] Inventors: Antoine Pavlin, Aix En Provence; Thierry Sicard, Fenouillet; Marc Simon, Tournefeuille, all of France

[73] Assignee: SGS-Microelectronics S.A., Gentilly, France

[21] Appl. No.: 618,281

[22] Filed: Nov. 28, 1990

[30] Foreign Application Priority Data

Nov. 29, 1989 [FR] France .................................. 89 16144

[51] Int. Cl.[5] ............................................. H01L 27/04
[52] U.S. Cl. ................................ 307/296.2; 307/127; 357/23.4; 357/48
[58] Field of Search ............... 307/296.2, 296.4, 296.5, 307/127; 357/40, 48, 43, 23.4

[56] References Cited

U.S. PATENT DOCUMENTS

| | | | |
|---|---|---|---|
| 4,024,417 | 5/1977 | Heuber et al. | 307/296.4 |
| 4,303,958 | 12/1981 | Allgood | 357/42 |
| 4,760,434 | 7/1988 | Tsuzuki et al. | 357/23.4 |
| 4,871,927 | 10/1989 | Dallqualle | 307/296.5 |
| 4,965,466 | 10/1990 | Pigott | 307/296.4 |
| 5,021,860 | 6/1991 | Bertotti et al. | 307/296.2 |

FOREIGN PATENT DOCUMENTS 3507181  3/1985  Fed. Rep. of Germany .

Primary Examiner—William D. Larkins
Attorney, Agent, or Firm—Lowe, Price, LeBlanc & Becker

[57] ABSTRACT

A dynamic isolation circuit belonging to a monolithic integrated circuit comprising lateral transistors and vertical transistors. The lateral transistors are isolated by an isolating region connected to an isolating potential ($V_{iso}$), these lateral transistors being connected up to voltages of a first polarity relative to a reference voltage (GND), the power terminal connected up to the rear face normally being at a potential ($V_{out}$) of the first polarity relative to the reference voltage. This circuit comprises a sign-detector (D) for detecting the sign of the potential of the rear face relative to the reference voltage, at least one lateral transistor (S1) to connect the isolating potential to the reference potential when the potential of the rear face is of the first polarity relative to the reference potential, and at least one vertical transistor (S2) to connect the isolating potential to the potential of the rear face when the potential of the rear face is of the second polarity relative to the reference potential.

12 Claims, 4 Drawing Sheets

CIRCUIT FOR DYNAMIC ISOLATION OF INTEGRATED CIRCUITS

The present invention relates to the field of integrated circuits and more particularly integrated circuits comprising lateral transistors and vertical transistors, in which the lateral transistors are, individually or in groups, junction isolated.

To place the problem posed, two examples of conventional configurations of integrated circuits comprising vertical transistors and lateral transistors will be recalled in connection with FIGS. 1 and 2.

FIG. 1 shows an integrated circuit formed in an n-type substrate 1 on the rear face of which a zone of excess $n^+$ doping 2 is provided, which is coated with a metallization 3. Illustrated in the right-hand part of the figure is a vertical n-channel MOS transistor cell 10 and in the left-hand part of the figure a logic part, or signal part, 20, in which lateral p-channel and n-channel MOS transistors are formed.

The vertical MOS transistor 10 comprises source regions 11 formed in channel regions 12 surmounted by an insulated gate 13. The source regions 11 are integral with a source metallization 14 also in contact with the caisson region 15 one part of which constitutes the channel region 12. Conventionally, a vertical power transistor (VDMOS) consists of a large number of parallel cells such as the cell 10.

The logic part 20 comprises p-channel MOS transistors 21 and n-channel MOS transistors 22. These transistors are formed in an n-type caisson 23 (the n-channel transistors being formed in a second caisson 24 arranged inside the caisson 23). The whole of the logic part is junction isolated by means of $p^+$-doped regions forming, on the one hand, a buried layer 25, on the other hand, lateral wells 26 joining with the buried layer 25. The isolating structure 25, 26 is connected through its upper part to isolating metallizations 27 connected to an isolating potential $V_{iso}$.

FIG. 2 shows another conventional integrated circuit structure making up vertical and lateral components. In this figure, elements similar to those of FIG. 1 are designated by the same numerical references.

The right-hand part of FIG. 2, corresponding to a cell of a vertical n-channel MOS transistor, is identical with the right-hand part of FIG. 1.

The logic transistor part is now designated by the reference 30. This part is formed in a $p^-$ caisson 31 of conductivity type opposite to that of the substrate. Only one n-channel transistor 32 has been represented there. The $p^-$ caisson is bordered by a $p^+$-type isolating well 36 connected to an isolating metallization 37 connected to an isolating potential $V_{iso}$. In this configuration, $V_{iso}$ is equal to the reference potential VSS of the signal part.

Furthermore, a vertical bipolar transistor 40 comprising a $p^-$-type base region 41 and an $n^+$-type emitter region 42 have been shown in FIG. 2. The collector of this vertical transistor corresponds to the drain of the vertical MOS transistor and the collector metallization will therefore be the rear face metallization 3. It will be noted that a vertical npn transistor could also have been provided in the structure of FIG. 1.

FIGS. 1 and 2 have been shown extremely schematically and are intended only to set out the problem related to the isolating of the lateral transistor regions (signal part or logic part).

In a usual operating mode of a vertical power transistor, the sources of the vertical MOS transistors (VDMOS) or the emitters of the vertical npn transistors are connected to earth and the, drains of the VDMOSs and the collectors of the vertical npn transistors (rear face) are connected to the high positive voltage. The logic circuits normally operate between the level of the earth and a positive supply voltage (VCC). In order for the caissons of the lateral transistors to be properly isolated, it is then expedient for the isolating potential $V_{iso}$ to be the most negative potential of the circuit, that is to say earth. In this case, as FIG. 3A illustrates very schematically, the terminal 27 (FIG. 1) or the terminal 37 (FIG. 2) is connected to earth and to the $p^+n$ diode 50 between the isolating region (25, 26; 36) and the rear face is in reverse mode between the high positive voltage $V_{out}$ and earth. The circuit is then properly isolated.

However, it is possible that in transitory fashion the voltage $V_{out}$ applied to the rear face metallization 3 may become negative, for example following a switching or spurious effects. Now, the isolating diode 50 illustrated in FIG. 3A is biased in forward mode. Numerous well known disadvantages result therefrom, namely:
- circulation of large spurious currents in the logic or signal zone,
- a high power consumption on the supply of the signal part,
- a risk of latch-up of possible CMOS structures contained in the logic caisson or caissons,
- a possible change of state of certain logic circuits such as memory locations, counters, etc.

To alleviate these disadvantages, it has been proposed in the prior art to connect the isolating potential $V_{iso}$ to earth not directly but by way of a diode 51, as is shown in FIG. 3B. Hence, the circulation of current between the isolating region and the rear face of the integrated circuit is thus normally blocked when the voltage $V_{out}$ on this rear face reverses. However, this solution presents numerous disadvantages:
- the diode 51 is not easy to integrate;
- the insertion of this diode 51 adds a diode threshold (about 0.6 volts) onto all the input/output voltages of the logic part; it results therefrom for example that this logic part may no longer be compatible with TTL type control signals;
- there is a risk of the circuit no longer operating when $V_{out}$ is negative, $V_{iso}$ then being at a floating potential; and
- as FIGS. 1 and 2 illustrate, there exists a parasitic pnp bipolar transistor Qp1 whose collector corresponds to the isolating region 26 or 36, whose emitter corresponds to the caisson 15 of the MOS power transistors, and whose base corresponds to the substrate 1 of the integrated circuit. When $V_{out}$ becomes negative, there is a risk of this element, arranged in parallel with the diode 51 as FIG. 3B illustrates, becoming conducting and so cancelling the effect of this diode 51.

Thus, an objective of the present invention is to provide an isolating circuit integrated into a monolithic circuit of the type illustrated in FIGS. 1 and 2 and making it possible to maintain the isolation and the correct operation of the logic parts of the circuit even when the high positive voltage reverses.

To achieve this objective, the present invention provides an integrated structure, referred to as a dynamic isolation circuit, making it possible to automatically connect up the isolating regions either to earth when the high rear face voltage of the integrated circuit is positive relative to earth or to this rear face voltage when this face becomes negative relative to earth.

More particularly, the present invention provides a dynamic isolation circuit belonging to a monolithic integrated circuit comprising lateral transistors whose terminals are accessible from the front face of the circuit and vertical transistors one power terminal of which corresponds to the rear face, the lateral transistors being isolated, individually or in groups, by an isolating region connected to a potential, referred to as an isolating potential, these lateral transistors being connected up to voltages of a first polarity relative to a reference voltage, the power terminal connected up to the rear face also normally being at a potential of the first polarity relative to the reference voltage. This circuit comprises means for detecting the sign of the potential of the rear face relative to the reference voltage, first switching means comprising at least one lateral transistor to connect the isolating potential to the reference potential when the potential of the rear face is of the first polarity relative to the reference potential, and second switching means comprising at least one vertical transistor to connect the isolating potential to the potential of the rear face when the potential of the rear face is of the second polarity relative to the reference potential.

According to an embodiment of the present invention, the reference potential is earth, the rear face of the integrated circuit corresponds to an $n^+$-type layer and the isolating region is of p-type, the first polarity being the positive polarity.

According to an embodiment of the present invention, the means for detecting the sign of the potential of the rear face relative to earth comprise a vertical npn transistor whose collector is connected to the rear face, the base is biased to a specified positive voltage less than the base-emitter voltage in the passing state of an npn transistor, and the emitter is connected to the normal positive supply voltage of the lateral transistors by way of a load element.

According to an embodiment of the present invention, the means for detecting the sign of the potential of the rear face relative to earth comprise an n-channel VDMOS transistor connected up to a lateral NMOS transistor whose other main terminal is connected to the normal positive supply voltage of the lateral transistors by way of a load element; the gate of the n-channel VDMOS transistor being biased to the positive supply voltage of the lateral transistors and the gate of the lateral NMOS transistor being biased to a value slightly greater than its threshold voltage.

According to an embodiment of the present invention, the first switching means comprise an enhanced n-channel MOS transistor whose source is connected to the reference potential, whose drain is connected up to the isolating regions and whose gate is controlled by the sign-detecting means, the substrate of the said MOS transistor preferably being connected to the reference potential.

According to an embodiment of the present invention, the second switching means comprise a vertical npn bipolar transistor whose emitter is connected to the rear face of the substrate, whose collector is connected up to the isolating regions and whose base is controlled through an inverter device by the sign-detecting means.

According to an embodiment of the present invention, the second switching means comprise a vertical n-channel MOS transistor whose drain is connected up to the rear face, whose source is connected up to the isolating potential and whose gate is controlled through an inverter by the sign-detecting means.

These objectives, characteristics and advantages as well as others of the present invention will be set out in more detail in the following description of particular embodiments made with reference to the attached figures in which:

FIGS. 1 to 3B, described previously, were intended to illustrate the state of the art and the problem which the present invention aims to solve; in these figures, FIGS. 1 and 2 show conventional integrated circuit structures with lateral and vertical transistors and FIGS. 3A and 3B equivalent diagrams of the isolation of the logic caissons;

Figure 1:
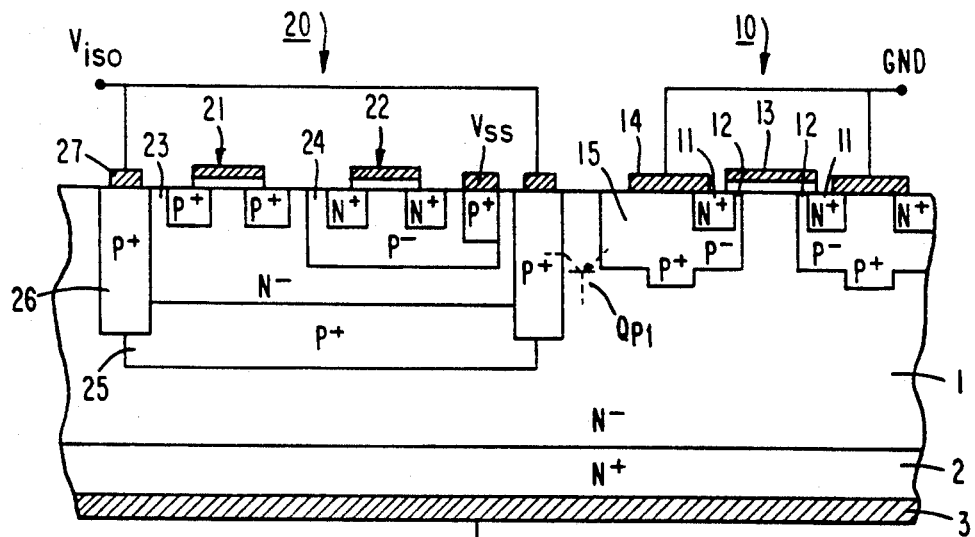
Figure 2:
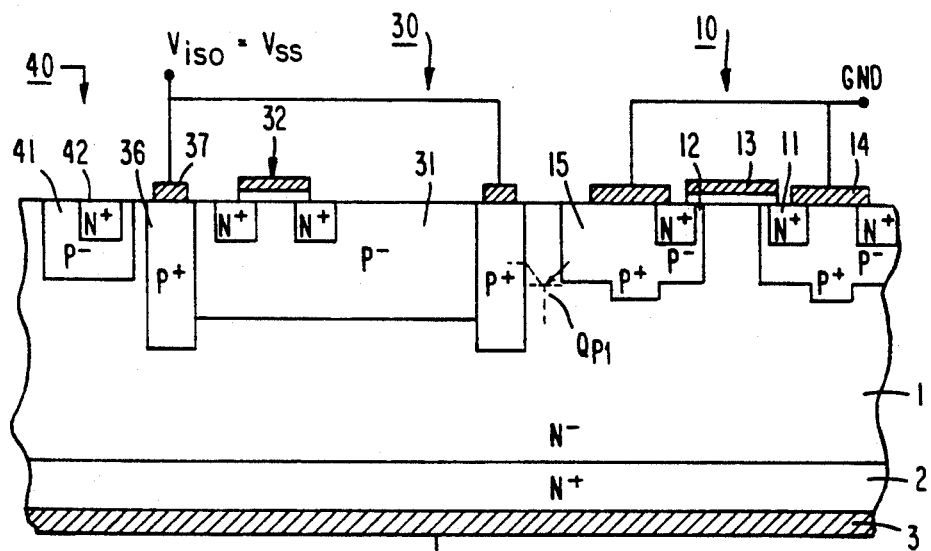
Figure 3A:
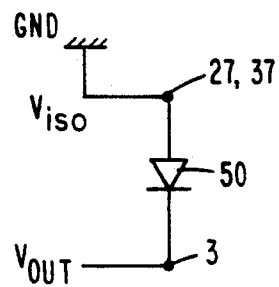
Figure 3B:
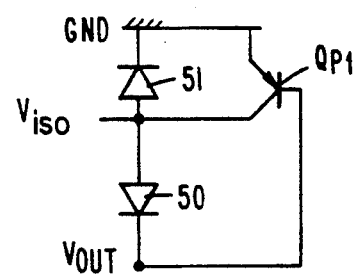
Figure 4:
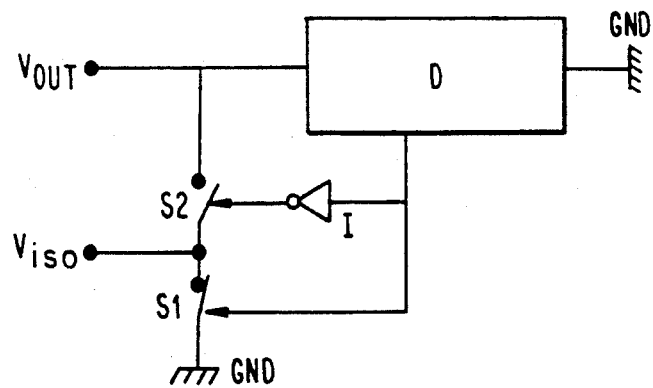
FIG. 4 illustrates the function which the circuit according to the present invention fulfils.

As FIG. 4 shows, a circuit according to the present invention comprises a polarity detector D to indicate whether the potential on the rear face of an integrated circuit such as that of FIGS. 1 and 2, comprising vertical and lateral components, is positive or negative relative to the reference voltage of the circuit, usually earth GND. According to the result of the comparison provided by the detector D, the voltage $V_{iso}$ applied to the isolating regions (25, 26; 36) is either earth GND, connected up by way of a first switch S1, or the rear face voltage $V_{out}$ connected up by way of a second switch S2. An inverter I makes it possible to control the switches S1 and S2 in opposition. Thus, the isolating potential $V_{iso}$ is always connected to the most negative potential of the circuit by way of a low impedance switch and the operation of the logic circuits continues to be satisfactory whatever the possible negative spurious effects on the rear face.

EXAMPLES OF CONSTRUCTION OF THE REAR FACE POLARITY DETECTOR

Figures 5, 6:
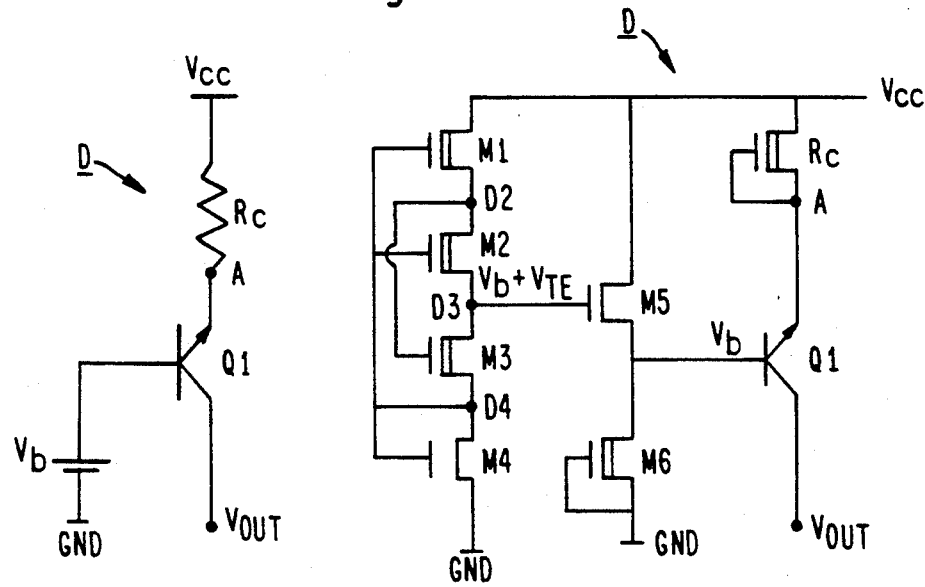
FIG. 5 shows a schematic example of a polarity detector.
FIG. 6 shows a more detailed example of a polarity detector.

A first embodiment of the detector D is shown schematically in FIG. 5. It comprises a vertical npn transistor Q1, for example of the type shown in the left-hand side of FIG. 2. However, this transistor is used by considering that the collector has an emitter function and the emitter a collector function. As FIG. 2 shows, the collector is connected by construction to the rear face voltage $V_{out}$. The emitter A which constitutes the output terminal is connected to the supply voltage of the logic circuits, +VCC, by way of a load resistance $R_c$ which may for example be a depleted MOS transistor.

According to the invention, the base of the transistor Q1 is connected up to a voltage source $V_b$ referred to earth, GND, and of a value less than the base-emitter conduction voltage (VBE) of an npn transistor, namely a voltage less than 0.6 volts, for example 0.2 volts. Thus, as long as the voltage $V_{out}$ is positive, the transistor Q1 is blocked and the point A is at the potential VCC (for example 5 to 15 V). On the other hand, as soon as the voltage $V_{out}$ becomes sufficiently negative for the voltage between base and emitter ($V_b - V_{out}$) of the transistor Q1 to become equal to a diode threshold voltage (VBE), the transistor Q1 becomes conductive and the point A essentially follows the potential $V_{out}$. Thus, a signal essentially at the voltage VCC is obtained on the output terminal A of the detector when $V_{out}$ is positive, and a signal essentially at $V_{out}$ when $V_{out}$ is negative (more negative than 200 mV-VBE).

FIG. 6 shows an example of a more detailed diagram of the circuit of FIG. 5. In this figure, the depleted n-channel MOS transistors have been symbolized with an additional vertical line. The circuit for providing the voltage $V_b$ (for example 200 millivolts) comprises four MOS transistors in series, three depleted MOS transistors M1, M2 and M3 and an enhanced MOS transistor M4, which are connected up between the voltage VCC and earth. The gates of the transistors M1, M2 and M4 are interconnected and connected to the drain/source connection D4 of the transistors M3 and M4. The gate of the transistor M3 is connected to the drain/source connection D2 of the transistors M1 and M2.

The transistor M1 is a "cascode" set-up which generates at the source of M1 (point D2) a voltage almost independent of the supply voltage VCC. The cell (M2, M3) is a reference voltage generating circuit of the "lambda cell" type which generates a potential difference $V_b$ between D3 and D4 which is slightly dependent on the potential difference $V(D2) - V(D4)$. The transistor M4 is a high transconductance enhanced transistor whose drain D4 biases to a voltage slightly different from its threshold voltage $V_{TE}$. Hence, the voltage at the point D3 takes up the value $V_{TE} + V_b$.

The voltage $V_b + V_{TE}$ at the point D3 is applied to a current-amplifying circuit comprising, in series, transistors M5 and M6, the transistor M5 being an enhanced NMOS transistor identical with the transistor M4 and the transistor M6 being a depleted NMOS transistor whose gate is connected to the source. The source of the transistor M6 is connected to earth and the drain of the transistor M5 is connected to VCC. Hence, at the drain/source connection point of the transistors M5 and M6, the voltage $V_b$ is obtained which it is desired to apply to the base of the transistor Q1 connected up, as is shown in FIG. 5, in series with a resistor $R_c$ constructed in the form of the depleted MOS transistor whose gate is connected to the drain.

Figure 7:
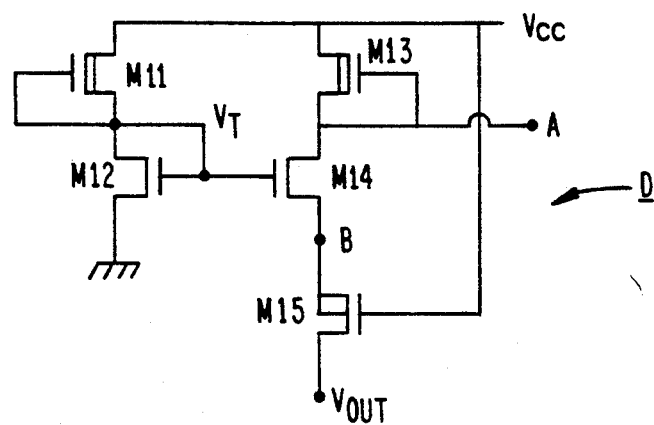
FIG. 7 shows another embodiment of a polarity detector.

Another example of construction of the detector D is shown in FIG. 7. This circuit comprises a depleted MOS transistor M11 and an enhanced MOS transistor M12 between the voltage VCC and earth. The gates of the transistors M11 and M12 are connected together at the drain/source connection of these transistors. Hence, on this drain/source connection, there is a voltage close to the threshold voltage $V_{TE}$ of an enhanced n-channel MOS transistor (the transistor M12). This circuit comprises moreover, between the voltage VCC and the rear face ($V_{out}$), a depleted n-channel MOS transistor M13, an enhanced n-channel MOS transistor M14 and a vertical type enhanced n-channel MOS transistor (VDMOS) M15. The connection between the transistors M14 and M15 is designated by the reference B. The gate of the transistor M13 is connected to the drain/source connection of the transistors M13 and M14 and constitutes the output terminal A of the detector. The gate of the transistor M14 is connected to the drain/source connection of the transistors M11 and M12, that is to say it is at a potential close to $V_{TE}$. The gate of the VDMOS transistor M15 is at the potential VCC.

The operation of this circuit is the following. When $V_{out}$ is positive, the voltage at the point B is limited to VCC less the threshold voltage of the VDMOS M15, that is to say VCC $- VT_{VDMOS}$. The gate voltage of the transistor M14 then being less than the source voltage, M14 is blocked and the voltage at the point A is equal to VCC.

When $V_{out}$ becomes negative, the transistor M15 is conductive and the voltage at the point B is essentially equal to $V_{out}$. Thus, the transistor M14 conducts a sufficient current for the voltage at the point A to drop to a voltage very close to $V_{out}$.

EXAMPLE OF CONSTRUCTION OF THE SWITCHES

FIG. 8 takes up again in slightly more detail the general diagram of the present invention previously shown in block form in FIG. 4.

In this representation, the switch S1 making it possible to establish the connection between the isolating voltage $V_{iso}$ and earth GND when $V_{out}$ is positive is realized through a lateral MOS transistor, and the switch S2 making it possible to establish the connection between the voltage $V_{iso}$ and the potential $V_{out}$ when $V_{out}$ is negative is realized through a vertical npn transistor S2. The other references of this circuit are identical to those used previously in FIG. 4. It will be noted that the inverter I is preferably supplied between VCC and the potential $V_{iso}$, that is to say GND or $V_{out}$ according to the sign of $V_{out}$. This makes it possible to better guarantee its operation in the case when $V_{out}$ is negative.

Figure 8:
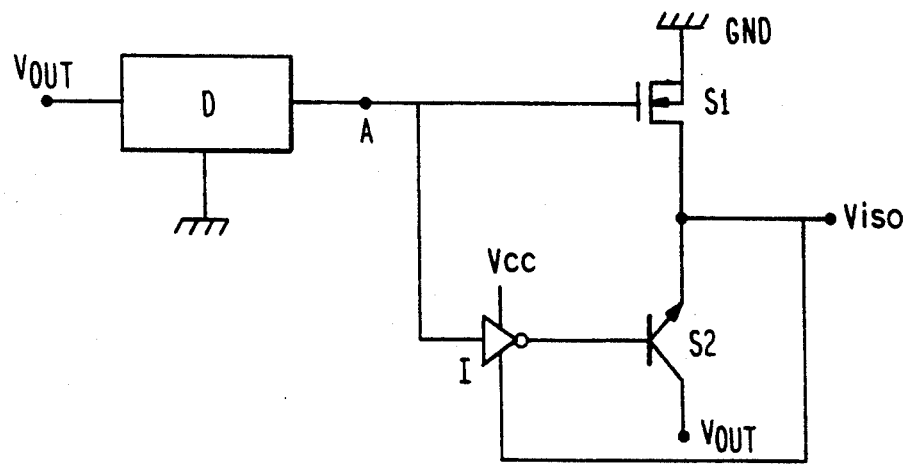
FIG. 8 shows the main elements of an embodiment of a circuit according to the present invention.
Figure 9:
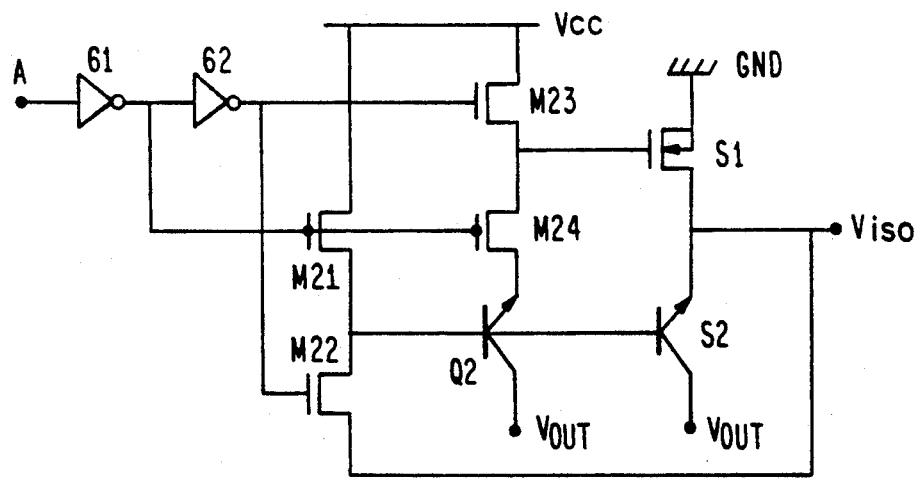
FIG. 9 shows, in slightly more detail, the main elements of an embodiment of a circuit according to the present invention.

FIG. 9 takes up again in slightly more detail the circuit of FIG. 8 given that in practice amplifier and adaptor stages will have to be provided to make the circuit operate satisfactorily.

The output terminal A of the detector D on which the potential $V_{out}$ (when $V_{out}$ is negative) or VCC (when $V_{out}$ is positive) is available, is connected to two inverters 61 and 62.

MOS transistors M21 and M22 are arranged in series between the supply voltage VCC and the potential $V_{iso}$. A MOS transistor M23, a MOS transistor M24 and an npn transistor Q2 are arranged in series between the supply voltage VCC and the voltage $V_{out}$. The output of the inverter 61 controls the gates of the transistors M21 and M24. The output of the inverter 62 controls the gates of the transistors M22 and M23. The drain/source connection point of the transistors M21 and M22 controls the bases of the bipolar transistors Q2 and S2 which are both vertical npn bipolar transistors. The drain/source connection point of the MOS transistors M23 and M24 controls the gate of the lateral MOS transistor S1.

The transistors M21 and M22 constitute a first follower amplifier stage whilst the transistors M23, M24 and Q2 constitute a second follower amplifier stage. These stages are intended to ensure the necessary control currents and a sufficiently rapid switching of the switches S1 and S2.

When the point A is at the potential VCC ($V_{out}$ positive), the transistors M22 and M23 are conductive the transistors M21 and M24 being blocked. It results therefrom that the npn transistors Q2 and S2 are blocked whereas the transistor S1 is conductive. The potential $V_{iso}$ is then indeed set to earth, GND, by way of the transistor S1.

When the point A is at the negative potential $V_{out}$, the state of the MOS transistors M21, M22, M23 and M24 reverses, the gate of the switch S1 is at $V_{out}$ and the base of the bipolar transistors Q2 and S2 is at $V_{out}+VBE$ that is to say this latter transistor is rendered conductive and the potential $V_{out}$ is set to the potential $V_{out}$, which is the result sought.

It follows from the above that, in fact, the voltage $V_{iso}$ will not be strictly equal to that of earth or to that of $V_{out}$, but that it will differ therefrom only by a voltage of a few tens of millivolts, corresponding for example to the collector/emitter voltage on saturation of a bipolar transistor or to the drain/source voltage drop of a MOS transistor in the conductive state.

The expert will note that the above constitutes only one example of construction of the present invention. As regards the transistor S1, this has previously been described as a MOS transistor; a bipolar transistor could also be used on condition that its control circuit be suitably modified. Similarly, a vertical MOS transistor instead of a vertical npn transistor could be provided for the transistor S2. More generally, the present invention can be used in the same way with p-channel transistors for the lateral MOSs and pnp for the vertical bipolars respectively.

Figure 10:
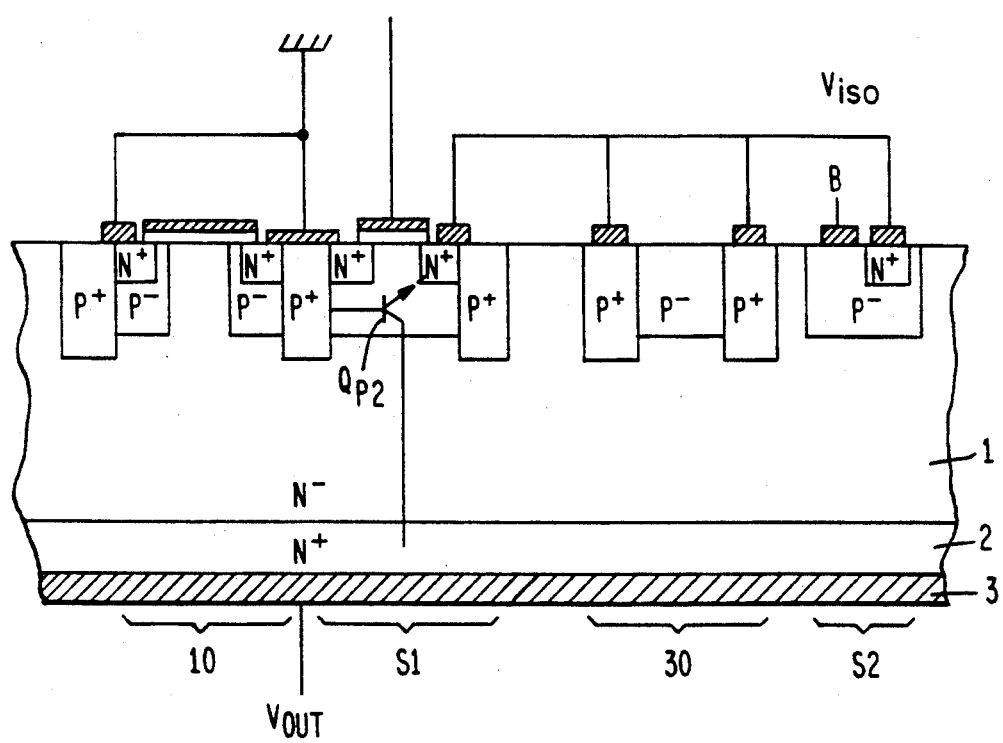
FIG. 10 shows schematically an example of integration of a circuit according to the present invention.

FIG. 10 shows in simplified fashion an example of integration of a circuit according to the present invention, corresponding to FIG. 8.

FIG. 10 shows, from right to left:
- a vertical npn transistor S2 whose base B receives the output from the detector D,
- a logic caisson such as the caisson 30 of FIG. 2, whose isolating regions are connected to the voltage $V_{iso}$,
- a lateral n-channel MOS transistor constituting the switch S1, and
- a VDMOS transistor cell such as the cell 10 of FIGS. 1 and 2.

As has been previously set out, the emitter of the vertical npn transistor S2 is connected to the potential $V_{iso}$ which is also connected to the drain of the transistor S1 whose source is connected to earth, taken for example as source connection for the VDMOS cell 10.

It will be noted that, according to an additional characteristic of the present invention, it is preferred to connect the p+ isolating region of the lateral MOS transistor S1 to earth and not to $V_{iso}$. In fact, in this case, when $V_{out}$ becomes negative, the spurious npn bipolar transistor QP2 illustrated in FIG. 10 becomes conducting and confirms the connection of $V_{iso}$ to $V_{out}$.

We claim:

1. In a monolithic integrated circuit formed in a semiconductor substrate of a first conductivity type, said semiconductor substrate having a front face and a rear face opposite to said front face, at least one power semiconductor device having first and second main terminals formed in said semiconductor substrate with said semiconductor substrate connected to said first main terminal of said power semiconductor device, said second main terminal being connected to a semiconductor region adjacent said front face, said semiconductor region being separated by at least one PN junction from said semiconductor substrate, said second main terminal of said power semiconductor device being connected to a reference potential, the polarity of the potential of said first main terminal with respect to said reference potential varying during operation of said power semiconductor device, an isolating region of second conductivity type in said semiconductor substrate and extending from said front face of said semiconductor substrate, said isolating region forming a PN junction with said semiconductor substrate, the PN junction between said isolating region and said semiconductor substrate being spaced from said at least one PN junction separating said semiconductor region from said semiconductor substrate by a portion of said semiconductor substrate, said isolating region being connected to an isolating potential terminal, at least one semiconductor device being located within said isolating region and separated from said semiconductor substrate by said isolating region, a dynamic isolation circuit comprising:

means for detecting, and for producing a signal indicative of, the polarity of the potential of said first main terminal relative to said reference potential, first switching means comprising at least one transistor for connecting said isolating potential terminal to said reference potential in response to said signal being indicative of the potential of said first main terminal being of a first polarity relative to said reference potential, said first polarity being such that connecting said isolating potential terminal to said reference potential reverse-biases the PN junction between said isolating region and said substrate, and second switching means, comprising at least one other transistor, for connecting said isolating potential terminal to said first main terminal in response to said signal being indicative of the potential of said first main terminal being of a second polarity relative to said reference potential, said second polarity being opposite to said first polarity.

2. A dynamic isolation circuit according to claim 1, wherein said reference potential is ground, said rear face of the integrated circuit corresponds to an n+-type layer and said isolating region is of p-type conductivity, said first polarity being a positive polarity.

3. A dynamic isolation circuit according to claim 2, wherein said means for detecting the polarity of the potential of said first main terminal comprises an npn transistor having a collector terminal connected to a first region and connected to said first main terminal, a base region biased to a specified positive potential relative to said reference potential and having a predetermined value less than a base-emitter potential difference of an npn transistor in the on state, and an emitter terminal connected to a second region and connected by a load element to a supply potential for said at least one semiconductor device within said isolating region, said supply potential being positive relative to said reference potential.

4. A dynamic isolation circuit according to claim 2, wherein said means for detecting the polarity of the potential of said first main terminal comprises an n-channel VDMOS transistor connected to a first main terminal of an NMOS transistor forming one of said semiconductor devices within said isolating region, a second main terminal of the NMOS transistor being connected by a load element to a positive supply potential for said at least one semiconductor device within said isolating region, said supply potential being positive relative to said reference potential; a gate of the n-channel VDMOS transistor being biased to the positive supply potential and a gate of the NMOS transistor being biased to a potential having a value relative to said reference potential which is slightly greater than a threshold voltage thereof.

5. A dynamic isolation circuit according to claim 2, wherein said first switching means comprises an enhanced n-channel MOS transistor having a source connected to the reference potential, a drain connected to the isolating regions and a gate controlled by the means for detecting the polarity of the operating potential of said first main terminal.

6. A dynamic isolation circuit according to claim 5, wherein a substrate of said MOS transistor is connected to the reference potential.

7. A dynamic isolation circuit according to claim 2, wherein said second switching means comprises an npn bipolar transistor having an emitter terminal connected to a first region and connected to said first main terminal, a collector terminal connected to a second region and connected to the isolating region and a base terminal controlled through an inverter device by said means for detecting the polarity of of the potential of said first main terminal.

8. A dynamic isolation circuit according to claim 2, wherein said second switching means comprises an n-channel MOS transistor having a drain connected to said first main terminal of the circuit, a source connected to the isolating potential terminal, and a gate controlled through an inverter by said means for detecting the polarity of the potential of said first main terminal.

9. In a monolithic integrated circuit formed in a substrate of a first conductivity type, said substrate having a front face and a rear face opposite to said front face, at least one power semiconductor device having first and second main terminals formed in said semiconductor substrate with said semiconductor substrate connected to said first main terminal of said power semiconductor device, said second main terminal being connected to a semiconductor region adjacent said front face, said semiconductor region being separated by at least one PN junction from said semiconductor substrate, said second main terminal connected to a reference potential, the polarity of the potential of said first main terminal with respect to said reference potential varying during operation of said power semiconductor device, isolating regions in said semiconductor substrate, said isolating regions being of a second conductivity type and extending from said front face of said semiconductor substrate, said isolating regions forming PN junctions with said semiconductor substrate, the PN junctions between said isolating regions and said semiconductor substrate being spaced from said at least one PN junction separating said semiconductor region from said semiconductor substrate by a portion of said semiconductor substrate, connecting means for providing an isolating potential to said isolating regions, a plurality of semiconductor devices located within said isolating regions and separated from said semiconductor substrate by said isolating regions, said semiconductor devices each having a pair of power terminals at said front face of the substrate, the improvement comprising:

a dynamic isolation circuit for isolating said connecting means from said reference potential when said polarity of the potential of said first main terminal with respect to said reference potential varies from a first polarity to a second polarity relative to said reference potential, said dynamic isolation circuit including:

polarity detecting means for detecting the polarity of the potential of said first main terminal relative to said reference potential and for outputting a signal indicative of the detected polarity, and switching means for connecting said connecting means to said reference potential in response to said signal being indicative of the potential of said first main terminal having said first polarity relative to the reference potential and for connecting said connecting means to said first main terminal when the signal outputted by said polarity detecting means is indicative of the potential of said first main terminal having said second polarity relative to said reference potential, said first polarity being such that connecting said connecting means to said reference potential reverse-biases the PN junction between said isolating regions and said substrate, thereby to prevent activation of a parasitic transistor formed in the substrate.

10. An improved monolithic integrated circuit in accordance with claim 9, wherein said switching means comprises:

first switching means connected between said reference potential and said connecting means and responsive to said signal being indicative of detection of said first polarity by said polarity detecting means; and second switching means connected between said first main terminal and said connecting means and responsive to said signal being indicative of detection of said second polarity by said polarity detecting means.

11. An improved monolithic integrated circuit in accordance with claim 10 wherein said polarity detecting means comprises an output terminal for outputting said signal, said output terminal connected to one of said first and second switching means, and further comprising inverting means connected to said output terminal to provide an inverse of said signal to the other of said first and second switching means.

12. An improved monolithic integrated circuit in accordance with claim 10 wherein said plurality of semiconductor devices comprise at least one transistor, said first switching means said at least one transistor for electrically connecting said connecting means to said reference potential when said signal is indicative of the potential of said first main terminal as being of said first polarity relative to the reference potential, and said second switching means comprises at least a further transistor for electrically connecting said connecting means to said first main terminal when said signal is indicative of the potential of said first main terminal as being of said second polarity relative to the reference voltage.

* * * * *